(12) United States Patent
Noda

(10) Patent No.: US 7,268,528 B2
(45) Date of Patent: Sep. 11, 2007

(54) CONSTANT-CURRENT CIRCUIT AND SYSTEM POWER SOURCE USING THIS CONSTANT-CURRENT CIRCUIT

(75) Inventor: Ippei Noda, Osaka (JP)

(73) Assignee: Ricoh Company, Ltd. (JP)

( * ) Notice: Subject to any disclaimer, the term of this patent is extended or adjusted under 35 U.S.C. 154(b) by 0 days.

(21) Appl. No.: 10/580,260

(22) PCT Filed: Sep. 26, 2005

(86) PCT No.: PCT/JP2005/018208

§ 371 (c)(1),
(2), (4) Date: May 25, 2006

(87) PCT Pub. No.: WO2006/040950

PCT Pub. Date: Apr. 20, 2006

(65) Prior Publication Data

US 2007/0108957 A1  May 17, 2007

(30) Foreign Application Priority Data

Oct. 8, 2004 (JP) ............................. 2004-296479

(51) Int. Cl.
*G05F 3/16* (2006.01)
(52) U.S. Cl. ...................................... 323/312; 323/315
(58) Field of Classification Search ................ 323/312, 323/314, 315, 316, 317
See application file for complete search history.

(56) References Cited

U.S. PATENT DOCUMENTS 5,757,175 A * 5/1998 Morishita et al. ........... 323/315

6,384,586 B1   5/2002 Sugawara
7,049,879 B2 * 5/2006 Osamura et al. ............ 327/419

FOREIGN PATENT DOCUMENTS

| JP | 4-276918 A | 10/1992 |
| JP | 08-321731 A | 12/1996 |
| JP | 2002-023870 A | 1/2002 |
| JP | 2002-304224 A | 10/2002 |
| JP | 2003-44153 A | 2/2003 |
| JP | 2004-152976 A | 5/2004 |

* cited by examiner

*Primary Examiner*—Adolf Berhane
(74) *Attorney, Agent, or Firm*—Dickstein Shapiro LLP

(57) ABSTRACT

A constant-current circuit and a system power source using this constant-current circuit are disclosed, which can generate plural highly accurate constant currents and supply them as bias currents by reducing variations caused by a change of a manufacturing process and a change of temperature. An operational amplification circuit AMP controls the operation of PMOS transistors M1 and M2 so that negative feedback is applied to a variation of one of currents i1 and i2 flowing from the PMOS transistors M1 and M2 and the variation is canceled. By making a constant current, which flows in a resistor R1 connected to a potential difference generated by a difference of current densities flowing in two pnp transistors Q1 and Q2 to which currents are correspondingly supplied from the PMOS transistors M1 and M2, to be a reference current; each of PMOS transistors MA1 through MAn whose operation is controlled by the operational amplification circuit AMP generates a current proportional to the reference current and outputs the generated current.

14 Claims, 7 Drawing Sheets

CONSTANT-CURRENT CIRCUIT AND SYSTEM POWER SOURCE USING THIS CONSTANT-CURRENT CIRCUIT

TECHNICAL FIELD

The present invention relates to a constant-current circuit which generates plural constant currents and outputs the generated constant currents and a system power source using this constant-current circuit; and in particular, a constant-current circuit which generates each of highly accurate bias currents being necessary for an error amplifying circuit, a short-circuit protecting circuit, and so forth, which are provided in plural constant-voltage circuits being a part of a system power source, and supplies the generated bias currents; and a system power source using this constant-current circuit.

BACKGROUND ART

Recently, the number of functions of an electronic instrument has increased, and characteristics of its power source being necessary for these functions have become varied; therefore, many kinds of power sources are required for the electronic instrument. Consequently, as shown in FIG. 8, a so-called system power source is being used, in which plural constant-voltage circuits REGX1 through REGXn (n is an integer where n>1) are integrated on one chip, power is supplied from the constant-voltage circuits REGX1 through REGXn to corresponding loads Lo1 through Lon, and each of the constant-voltage circuits REGX1 through REGXn is controlled totally by a control circuit (not shown):

FIG. 9 is a diagram showing a circuit example of one of the constant-voltage circuits REGX1 through REGXn shown in FIG. 8. Since each of the constant-voltage circuits REGX1 through REGXn has the same structure, in FIG. 9, an arbitrary constant-voltage circuit REGXk (k=1 to n) is shown.

The constant-voltage circuit REGXk consists of a reference voltage generating circuit REFk, an error amplifying circuit APk, a transistor for controlling output voltage PBk, and resistors for detecting output voltage RXk and RYk, and outputs a generated output voltage Vok to a corresponding load Lok.

The reference voltage generating circuit REFk consists of a depletion-mode NMOS transistor NAk and an enhancement-mode NMOS transistor NBk (hereinafter, an enhancement-mode NMOS transistor is simply referred to as an NMOS transistor and an enhancement-mode PMOS transistor is simply referred to as a PMOS transistor). In the depletion-mode NMOS transistor NAk, the drain is connected to a power source Vdd, and the gate and the source are connected; therefore, the drain current of the depletion-mode NMOS transistor NAk becomes a constant current when the voltage between the gate and the source of the depletion-mode NMOS transistor NAk Vgs equals to 0.

To the source of the depletion-mode NMOS transistor NAk, the drain of the NMOS transistor NBk is connected, and in the NMOS transistor NBk, the source is connected to ground voltage, and the gate is connected to the drain. Therefore, the drain current of the NMOS transistor NBk becomes equal to the drain current being the constant current of the depletion-mode NMOS transistor NAk. From this, the gate voltage of the NMOS transistor NBk is determined by the drain current of the depletion-mode NMOS transistor NAk, and this voltage becomes a reference voltage Vrefk which is output from the reference voltage generating circuit REFk.

The error amplifying circuit APk controls the operation of the transistor for controlling output voltage PBk so that a voltage VXk, which is the output voltage Vok divided by the resistors for detecting output voltage RXk and RYk, becomes the reference voltage Vrefk.

In the system power source, in a case where 20 or more constant-voltage circuits are formed on one chip, if a bias current setting circuit and a reference voltage generating circuit are provided in each constant-voltage circuit, there is a problem in which the entire area of the semiconductor chip becomes large. In order to solve this problem, a bias current source circuit for supplying bias currents to many analog basic circuits is disclosed (for example, refer to Patent Document 1) in which a PMOS transistor and an NMOS transistor are connected in series between a power source voltage and ground voltage, the power source voltage is divided by this series circuit, and gates of many NMOS transistors and PMOS transistors are connected to this divided voltage.

[Patent Document 1] Japanese Laid-Open Patent Application No. 8-321731

However, the characteristics of the MOS transistor change due to a variation in its manufacturing process and a difference of chip positions in one wafer. Consequently, there is a problem in which bias current values to NMOS transistors NCk and NDk being a differential pair of the error amplifying circuit APk and to a PMOS transistor PEk being an output stage of the error amplifying circuit APk in FIG. 9 are greatly dispersed. In addition, the dispersion of the drain current at the time of 0 bias of the depletion-mode NMOS transistor NAk is as large as −50% to +100%. Further, the dispersion of the temperature characteristic is ±20 to 30% in the using temperature range (−30° C. to 85° C.). Due to these, the reference voltage Vrefk to be output from the reference voltage generating circuit REFk and the drain current of the NMOS transistor NBk are changed largely caused by the variations of the manufacturing process and the temperature. Further, the characteristics of the reference voltage generating circuit REFk are changed and also the reference voltage Vrefk is changed. These are problems. Since the change of the reference voltage Vrefk directly affects the change of the output voltage Vok, the resistance ratio between the resistors for detecting output voltage RXk and RYk is required to be adjusted by trimming and so on.

In the system power source, there is a case in which 20 or more constant-voltage circuits are provided on one chip, and when the value of the bias current of the error amplifying circuit included in each constant-voltage circuit and the value of the constant-current load are greatly dispersed, a problem occurs in which the current consumption of the system power source exceeds its specification. In addition, since the amount of phase compensation of the error amplifying circuit is changed by the bias current value, a problem occurs in which the most suitable phase compensation is not executed. Further, since the change of the bias current causes the change of the various characteristics to be required for the constant-voltage circuits such as a ripple eliminating ratio, an input voltage response characteristic, and an output voltage response characteristic, it is necessary that the bias current be in a predetermined current value range in order to obtain the characteristics in its specifications.

DISCLOSURE OF THE INVENTION

The present invention solves one or more of the above problems of the related art, and provides a constant-current circuit, which can generate plural highly accurate constant currents and supply them as bias currents by reducing variations caused by a change of a manufacturing process and a change of temperature, and a system power source using this constant-current circuit.

According to one aspect of the present invention, there is provided a constant-current circuit that generates plural constant currents and outputs the generated constant currents. The constant-current circuit includes a first transistor that generates a current corresponding to a signal input to a control electrode and outputs the generated current; a first pn junction element to which the current output from the first transistor is supplied; a second transistor that generates a current corresponding to a signal input to a control electrode and outputs the generated current; a first series circuit in which a first resistor and a second pn junction element are connected in series and to which the current output from the second transistor is supplied; a control circuit that controls the operation of the first and the second transistors so that a voltage of a connection point of the second transistor with the first resistor is equal to that of a connection point of the first transistor with the first pn junction element; and a proportional current generating circuit that generates plural currents being proportion to a current flowing in the first resistor. The first resistor is connected to a potential difference generated by a difference of current densities flowing in the first and the second pn junction elements, the proportional current generating circuit consists of plural transistors for generating proportional current to whose control electrodes a control signal output from the control circuit to the second transistor is input, and a current proportional to a current flowing in the first resistor is generated in each of the transistors for generating proportional current and the generated current is output.

Specifically, the control circuit is an operational amplification circuit to whose corresponding input terminals the voltage of the connection point of the second transistor with the first resistor and the voltage of the connection point of the first transistor with the first pn junction element are respectively input, and the operation of the first and the second transistors and the transistors for generating proportional current is controlled by the operational amplification circuit.

In addition, the first resistor has a temperature characteristic that offsets a temperature characteristic of a potential difference generated by a difference of current densities flowing in the first and the second pn junction elements.

In addition, the constant-current circuit further includes a third transistor that generates a current corresponding to a signal input from the control circuit to a control electrode and outputs the generated current; and a second series circuit in which a second resistor and a third pn junction element are connected in series and to which the current output from the third transistor is supplied. A voltage of a connection point of the third transistor with the second resistor is output as a predetermined reference voltage.

In addition, each resistance value and each temperature coefficient of the first and the second resistors are set respectively so that a variation of the reference voltage caused by the temperature characteristic of a voltage at the both ends of the third pn junction element is offset.

In addition, the first and the second transistors are MOS transistors whose sources are connected to each other and gates are connected to each other, and the transistors for generating proportional current are MOS transistors whose sources are connected to the sources of the first and the second transistors and whose gates are connected to the gates of the first and the second transistors.

In addition, the first through the third transistors are MOS transistors whose sources are connected to each other and gates are connected to each other, and the transistors for generating proportional current are MOS transistors whose sources are connected to the sources of the first through the third transistors and whose gates are connected to the gates of the first through the third transistors.

According to the present invention, there is provided a system power source providing plural constant-voltage circuits that generate predetermined voltages and output the generated voltages to corresponding loads. The system power source includes a constant-current circuit that generates plural constant currents and outputs the generated constant currents to the corresponding constant-voltage circuits as bias currents. The constant-current circuit includes a first transistor that generates a current corresponding to a signal input to a control electrode and outputs the generated current; a first pn junction element to which the current output from the first transistor is supplied; a second transistor that generates a current corresponding to a signal input to a control electrode and outputs the generated current; a first series circuit in which a first resistor and a second pn junction element are connected in series and to which the current output from the second transistor is supplied; a control circuit that controls the operation of the first and the second transistors so that a voltage of a connection point of the second transistor with the first resistor is equal to that of a connection point of the first transistor with the first pn junction element; and a proportional current generating circuit that generates plural currents being proportional to a current flowing in the first resistor. The first resistor is connected to a potential difference generated by a difference of current densities flowing in the first and the second pn junction elements, the proportional current generating circuit consists of plural transistors for generating proportional current to whose control electrodes a control signal output from the control circuit to the second transistor is input, and a current proportional to a current flowing in the first resistor is generated in each of the transistors for generating proportional current and the generated current is output.

Specifically, in the system power source, the control circuit is an operational amplification circuit to whose corresponding input terminals the voltage of the connection point of the second transistor with the first resistor and the voltage of the connection point of the first transistor with the first pn junction element are respectively input, and the operation of the first and the second transistors and the transistors for generating proportional current is controlled by the operational amplification circuit.

In addition, in the system power source, the first resistor has a temperature characteristic that offsets a temperature characteristic of a potential difference generated by a difference of current densities flowing in the first and the second pn junction elements.

In addition, in the system power source, the constant-current circuit further includes a third transistor that generates a current corresponding to a signal input from the control circuit to a control electrode and outputs the generated current; and a second series circuit in which a second resistor and a third pn junction element are connected in series and to which the current output from the third transistor is supplied. A voltage of a connection point of the third transistor with the second resistor is supplied to at least one of the constant-voltage circuits as a predetermined reference voltage.

In addition, in the system power source, each resistance value and each temperature coefficient of the first and the second resistors are set respectively so that a variation of the reference voltage caused by the temperature characteristic of a voltage at the both ends of the third pn junction element is offset.

In addition, in the system power source, the first and the second transistors are MOS transistors whose sources are connected to each other and whose gates are connected to each other, and the transistors for generating proportional current are MOS transistors whose sources are connected to the sources of the first and the second transistors and whose gates are connected to the gates of the first and the second transistors.

In addition, in the system power source, the first through the third transistors are MOS transistors whose sources are connected to each other and whose gates are connected to each other, and the transistors for generating proportional current are MOS transistors whose sources are connected to the sources of the first through the third transistors and whose gates are connected to the gates of the first through the third transistors.

According to the constant-current circuit of the present invention, the first resistor is connected to the potential difference generated by the difference of the current densities flowing in the first and the second pn junction elements; and the plural transistors for generating proportional current, to whose control electrodes a control signal output from the control circuit to the second transistor is input, generate currents proportional to a current flowing in the first resistor and output the generated currents. Due to this, plural highly accurate constant-currents can be generated and supplied by reducing variations caused by a change of a manufacturing process and a change of temperature. In addition, in the system power source providing plural constant-voltage circuits that generate predetermined constant voltages and output the generated constant voltages to corresponding loads, in order that predetermined plural constant currents are generated and the generated constant currents are supplied to the corresponding loads as the bias currents, this constant-current circuit is used; therefore, the dispersion in the performance of the constant-voltage circuits can be made small, and the highly accurate constant voltages can be generated and supplied to the loads.

In addition, the constant-current circuit further includes a third transistor that generates a current corresponding to a signal input from the control circuit to a control electrode and outputs the generated current, and a second series circuit in which a second resistor and a third pn junction element are connected in series and to which the current output from the third transistor is supplied, so that a voltage of a connection point of the third transistor with the second resistor is output as a predetermined reference voltage. Therefore, it is not necessary that a circuit for generating a reference voltage be additionally provided. In particular, by using such a constant-current circuit in a system power source providing plural constant-voltage circuits that generate predetermined voltages and supply them to corresponding loads, a reference voltage generating circuit provided in each of the constant-voltage circuits is not necessary, and a highly accurate reference voltage whose temperature characteristic is excellent and dispersion is low can be obtained, compared with the conventional circuit. Therefore, trimming for adjusting the output voltages of the constant-voltage circuits is not required and the chip area of the system power source can be made small.

These and other objects, features, and advantages of the present invention will become more apparent from the following detailed description of preferred embodiments given with reference to the accompanying drawings.

BEST MODE FOR CARRYING OUT THE INVENTION

Figure 1:
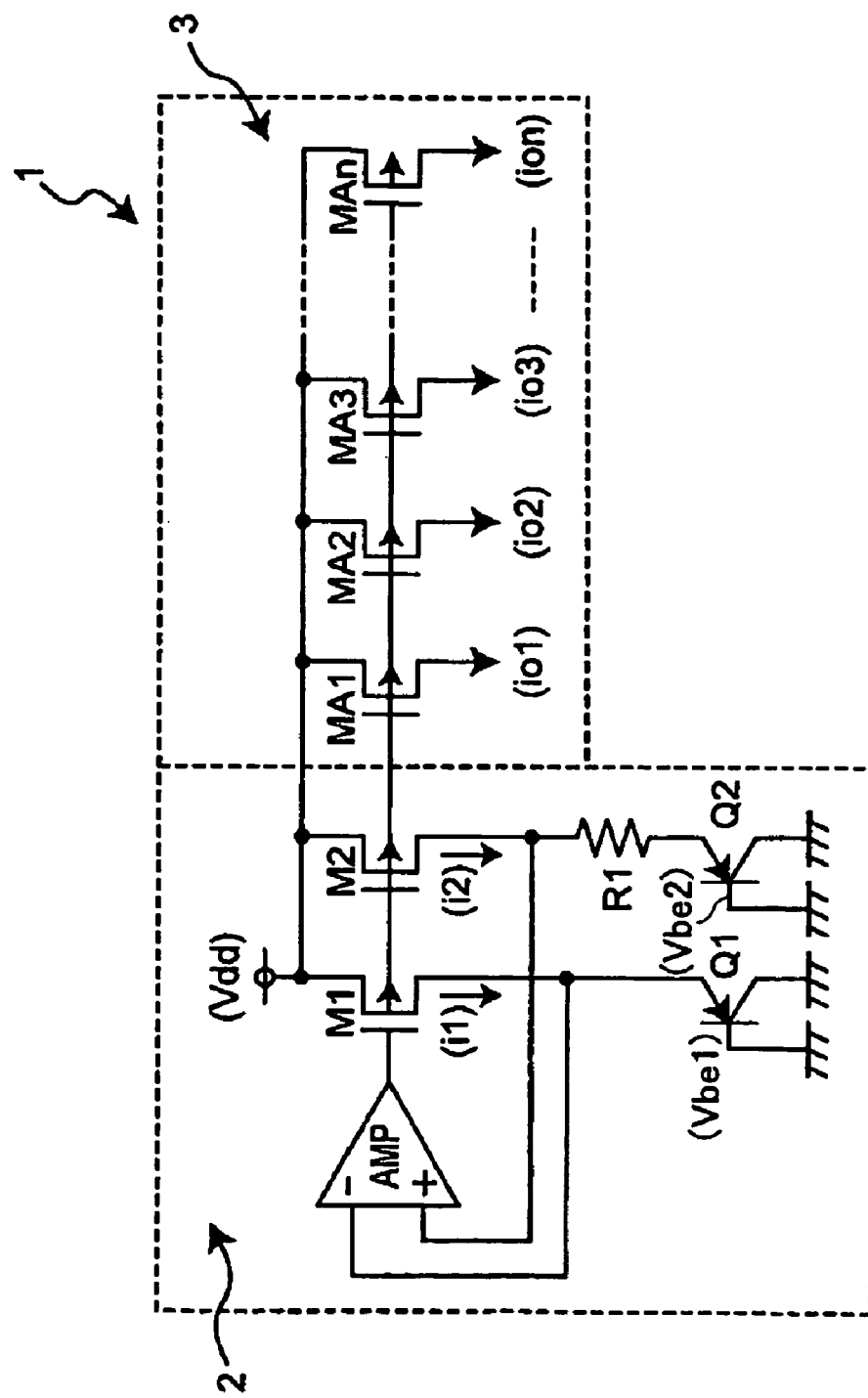
FIG. 1 is a diagram showing a structural example of a constant-current circuit according to a first embodiment of the present invention.

Next, based on embodiments shown in the drawings, the present invention is explained in detail.

First Embodiment

FIG. 1 is a diagram showing a structural example of a constant-current circuit according to a first embodiment of the present invention.

In FIG. 1, a constant-current circuit 1 generates plural predetermined constant currents io1 through ion (n is an integer where n>1) and outputs the generated constant currents; and consists of a reference current generating circuit 2 that generates a predetermined reference current and a proportional current generating circuit 3 that generates the plural predetermined constant currents io1 through ion, which are proportional to the reference current generated at the reference current generating circuit 2, and outputs the generated constant currents.

The reference current generating circuit 2 consists of an operational amplification circuit AMP, two pnp transistors Q1 and Q2, a resistor R1, and two PMOS transistors M1 and M2. Between a power source voltage Vdd and ground voltage, the PMOS transistor M1 and the pnp transistor Q1 are connected in series, and the PMOS transistor M2, the resistor R1, and the pnp transistor Q2 are connected in series. A connection point of the PMOS transistor M1 with the pnp transistor Q1 is connected to an inverting input terminal of the operational amplification circuit AMP, and a connection point of the PMOS transistor M2 and the resistor R1 is connected to a non-inverting input terminal of the operational amplification circuit AMP. The gates of the PMOS transistors M1 and M2 are connected to an output terminal of the operational amplification circuit AMP, and the bases of the pnp transistors Q1 and Q2 are connected to ground voltage. The drain current of the PMOS transistor M1 is defined as i1 and the drain current of the PMOS transistor M2 is defined as i2, and the drain current i2 is the reference current.

The proportional current generating circuit 3 consists of PMOS transistors MA1 through MAn. The sources of the PMOS transistors MA1 through MAn are connected to the power source voltage vdd, and the gates of the PMOS transistors MA1 to MAn are connected to the output terminal of the operational amplification circuit AMP. From the drains of the PMOS transistors MA1 through MAn, constant currents io1 through ion are output, respectively. In this embodiment, the PMOS transistor M1 is a first transistor, the PMOS transistor M2 is a second transistor, the pnp transistor Q1 is a first pn junction element, the pnp transistor Q2 is a second pn junction element, and the resistor R1 is a first resistor. In addition, the series circuit composed of the resistor R1 and the pnp transistor Q2 is a first series circuit, the operational amplification circuit AMP is a control circuit, and each of the PMOS transistors MA1 through MAn is a transistor for generating a proportional current.

In this structure, the drain current i1 of the PMOS transistor M1 is the emitter current of the pnp transistor Q1, and the drain current i2 of the PMOS transistor M2 is the emitter current of the pnp transistor Q2. The PMOS transistors M1 and M2 have the same characteristics, and as shown in FIG. 1, when the voltages between the gates and the sources are the same, the same drain current flows.

Since each of the drains of the PMOS transistors M1 and M2 is connected to the corresponding input terminal of the operational amplification circuit AMP, the gate voltages of the PMOS transistors M1 and M2 are controlled so that the drain voltages of the PMOS transistors M1 and M2 become the same voltage due to control by the operational amplification circuit AMP.

As a result, the voltage Vbe1 between the base and the emitter of the pnp transistor Q1 becomes equal to the voltage drop across the resistor R1 plus the voltage Vbe2 between the base and the emitter of the pnp transistor Q2. The element size of the pnp transistor Q2 is larger than that of the pnp transistor Q1, so when the same emitter current is supplied, the voltage Vbe2 between the base and the emitter of the pnp transistor Q2 becomes lower than the voltage Vbe1 between the base and the emitter of the pnp transistor Q1.

When the above-mentioned relation is shown by an equation, the following equation (1) is obtained. In the following equation, R1 is a resistance value of the resistor R1.

$$Vbe1 = Vbe2 + i2 \times R1 \qquad (1)$$

$$i2 = (1/R1) \times (Vbe1 - Vbe2)$$

When $\Delta Vbe = Vbe1 - Vbe2$, the following equation (2) is obtained.

$$i2 = (1/R1) \times \Delta Vbe \qquad (2)$$

From equation (2), it is understandable that the value of the drain current i2 of the PMOS transistor M2 is determined by the element size difference between the pnp transistor Q1 and the pnp transistor Q2 and the resistance value of the resistor R1.

Since the temperature coefficient of $\Delta Vbe$ is positive, by selecting the temperature coefficient of the resistor R1 to offset the temperature coefficient of $\Delta Vbe$, the temperature coefficient of the drain current i2 of the PMOS transistor M2 can be very small. The dispersion of the resistor R1 in manufacturing is approximately ±5% in the resistance value and approximately ±5% in the temperature coefficient (−30° C. to 85° C.). Since the above-mentioned variation range is the dispersion of the reference current i2, the reference current can be set with high accuracy compared with in the conventional technology.

The constant currents io1 through ion to be output from the PMOS transistors MA1 through Man, respectively, of the proportional current generating circuit 3 are not necessarily the same, and can be set arbitrarily by the element sizes of the respective PMOS transistors MA1 through MAn.

Figure 2:
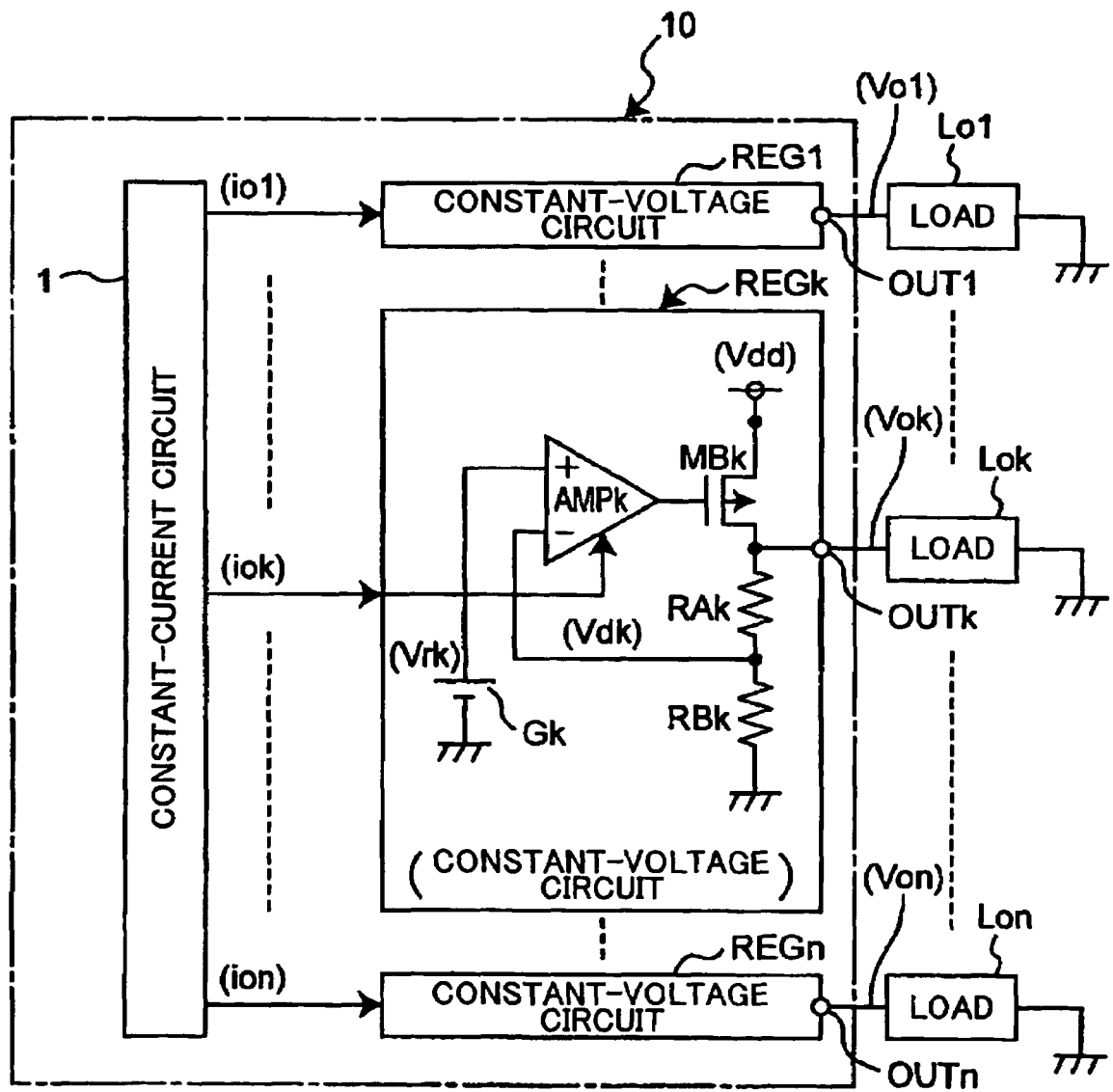
FIG. 2 is a diagram showing an example of a system power source used a constant-current circuit 1 shown in FIG. 1.

FIG. 2 is a diagram showing an example of a system power source used the constant-current circuit 1 shown in FIG. 1.

In FIG. 2, a system power source 10 provides plural constant-voltage circuits REG1 through REGn that generate predetermined constant voltages Vo1 through Von and output them to loads Lo1 through Lon respectively, and the constant-current circuit 1. Since each of the constant-voltage circuits REG1 through REGn has the same circuit structure, in FIG. 2, only an inside circuit example of an arbitrary constant-voltage circuit REGk (k=1 to n) is shown, and the other constant-voltage circuits are equal to the constant-voltage circuit REGk; therefore, their inside circuits are omitted. Below, the constant-voltage circuit REGk is explained as an example.

The constant-voltage circuit REGk consists of a reference voltage generating circuit Gk that generates a predetermined reference voltage Vrk and outputs it, an error amplifying circuit AMPk, a transistor for controlling output voltage MBk, and resistors for detecting output voltage RAk and RBk; and outputs a generated output voltage Vok to a load Lok connected to an output terminal OUTk.

Between the power source voltage Vdd and the output terminal OUTk, the transistor for controlling output voltage MBk is connected, and between the output terminal OUTk and ground voltage, the resistors RAk and RBk are connected in series. A divided voltage Vdk generated by dividing the output voltage Vok by the resistors RAk and RBk is input to the inverting input terminal of the operational amplification circuit AMPk, and the reference voltage Vrk is input to the non-inverting input terminal of the operational amplification circuit AMPk. The output terminal of the operational amplification circuit AMPk is connected to the gate of the transistor for controlling output voltage MBk, and the operational amplification circuit AMPk controls the operation of the transistor for controlling output voltage MBk so that the divided voltage Vdk becomes the reference voltage Vrk.

To the operational amplification circuit AMPk, a constant current iok is supplied from the constant-current circuit 1 as a bias current.

Figure 3:
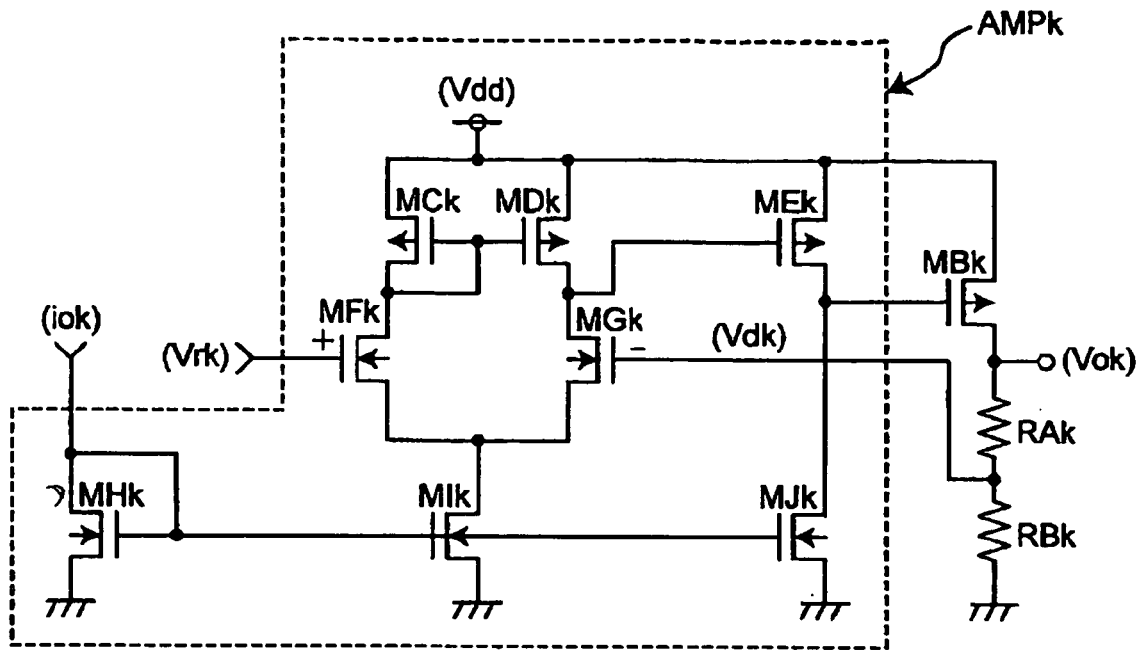
FIG. 3 is a diagram showing a circuit example of an operational amplification circuit AMPk shown in FIG. 2.

FIG. 3 is a diagram showing a circuit example of the operational amplification circuit AMPk.

In FIG. 3, the operational amplification circuit AMPk consists of PMOS transistors MCk through MEk, and NMOS transistors MFk through MJk. The PMOS transistors MCk and MDk form a current mirror circuit, and become a load for the NMOS transistors MFk and MGk being a differential pair. In the PMOS transistors MCk and MDk, each source is connected to the power source voltage Vdd, each gate is connected to the other and their connection point is connected to the drain of the PMOS transistor MCk.

To the drain of the PMOS transistor MCk, the drain of the NMOS transistor MFk is connected, and to the drain of the PMOS transistor MDk, the drain of the NMOS transistor MGk is connected. The gate of the NMOS transistor MFk is the non-inverting input terminal of the operational amplification circuit AMPk, and the reference voltage Vrk is input to the gate. In addition, the gate of the NMOS transistor MGk is the inverting input terminal of the operational amplification circuit AMPk, and the divided voltage Vdk is input to the gate. Each source of the NMOS transistors MFk and MGk is connected to the other, and between their connection point and ground voltage, the NMOS transistor MIk is connected.

Here, the NMOS transistors MHk through MJk form a current mirror circuit, each gate of the NMOS transistors MHk to MJk is connected to the others, and their connection point is connected to the drain of the NMOS transistor MHk, and the constant current iok from the constant-current circuit 1 is input to the drain.

In addition, between the power source voltage Vdd and ground voltage, the PMOS transistor MEk and the NMOS transistor MJk are connected in series, and the connection point of the PMOS transistor MDk with the NMOS transistor MGk is connected to the gate of the PMOS transistor MEk. Further, the connection point of the PMOS transistor MEk with the NMOS transistor MJk is the output terminal of the operational amplification circuit AMPk and is connected to the gate of the transistor for controlling output voltage MBk.

In this structure, the PMOS transistors MCk and MDk, and the NMOS transistors MFk, MGk, and MIk form a differential amplification stage; and by the current mirror circuit of the NMOS transistors MHk and MIk, a current proportional to the constant current iok is supplied to the NMOS transistors MFk and MGk being a differential pair as a bias current. In addition, the PMOS transistors MEk and the NMOS transistors MJk form an amplification stage, and by the current mirror circuit of the NMOS transistors MHk and MJk, a current proportional to the constant current iok is supplied to the PMOS transistor MEk as a bias current. In this way, the constant current iok from the constant-current circuit 1 is supplied to the operational amplification circuit AMPk as the bias current.

Figure 4:
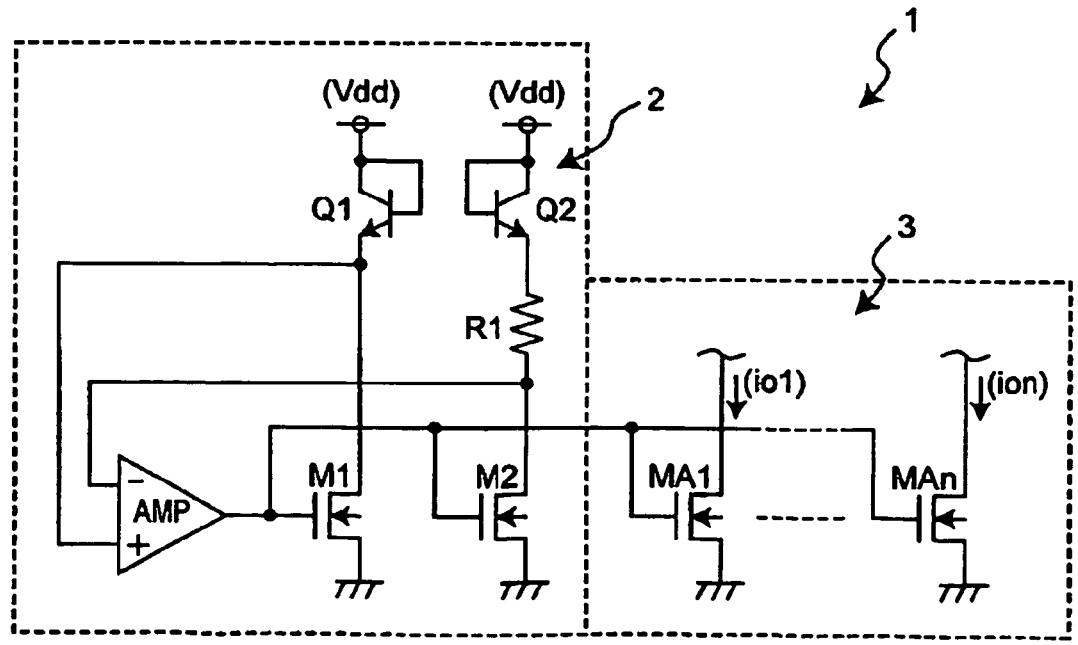
FIG. 4 is a diagram showing another structural example of the constant-current circuit according to the first embodiment of the present invention.
Figure 5:
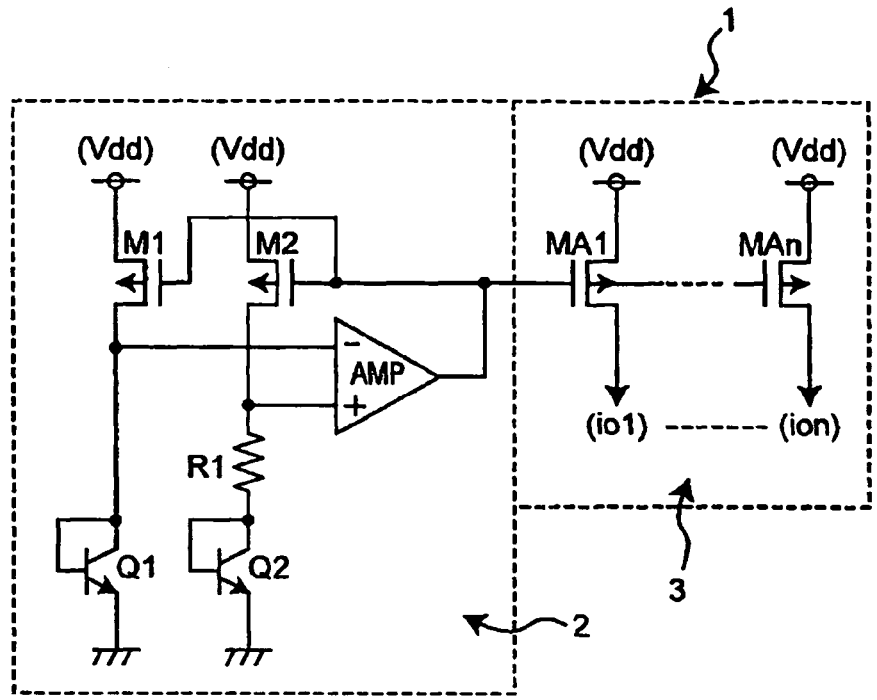
FIG. 5 is a diagram showing another structural example of the constant-current circuit according to the first embodiment of the present invention.

Here, in FIG. 1, a case in which the constant-current circuit 1 is formed by using the PMOS transistors and the pnp transistors is shown as an example; however, the constant-current circuit 1 can be formed by using NMOS transistors and npn transistors; in this case, the structure shown in FIG. 1 becomes the structure shown in FIG. 4. In FIG. 4, each of structural elements corresponding to that shown in FIG. 1 has the same reference number. In addition, in FIG. 1, the bases of the pnp transistors Q1 and Q2 are connected to ground voltage; however, as shown in FIG. 5, instead of using the pnp transistors Q1 and Q2, npn transistors each of whose base and collector are connected can be used. In this, also in FIG. 5, each of structural elements corresponding to that shown in FIG. 1 has the same reference number.

As mentioned above, in the constant-current circuit according to the first embodiment of the present invention, the operational amplification circuit AMP controls the operation of the MOS transistors M1 and M2 so that negative feedback is applied to the variation of one of the currents i1 and i2 flowing from the MOS transistors M1 and M2, respectively, and the variation is canceled. By making the constant current, which flows in the resistor R1 connected to the potential difference generated by the difference of the current densities flowing in the bipolar transistors Q1 and Q2 to which currents are respectively supplied from the MOS transistors M1 and M2, the reference current, each of the MOS transistors MA1 through MAn whose operation is controlled by the operational amplification circuit AMP respectively generates the current proportional to the reference current and outputs the generated current. Due to this, the constant-current circuit can generate plural accurate constant currents and supply the generated currents as the bias currents by reducing the variations caused by the change of the manufacturing process and the change of the temperature.

In addition, since the constant currents generated by the constant-current circuit in the first embodiment of the present invention are supplied, as the bias currents, to the corresponding constant-voltage circuits REG1 through REGn, which the system power source 10 has, the dispersion of the performance of each of the constant-voltage circuits can be made small, the dispersion of the current consumption of the entire system power source becomes small, and the phase compensation of each of the error amplifying circuits becomes stable. Further, the stabilization of the various characteristics to be required for the constant-voltage circuits, such as a ripple eliminating ratio, an input voltage response characteristic, and an output voltage response characteristic, can be realized.

Second Embodiment

In the above-mentioned first embodiment, the reference voltage generating circuits G1 through Gn are respectively provided in the constant-voltage circuits REG1 through REGn; however, when some of the constant-voltage circuits REG1 through REGn have the same reference voltage, it is possible that the constant-current circuit 1 generate the reference voltage and supply the voltage to several of the constant-voltage circuits REG1 through REGn; this is applied to the second embodiment.

Figure 6:
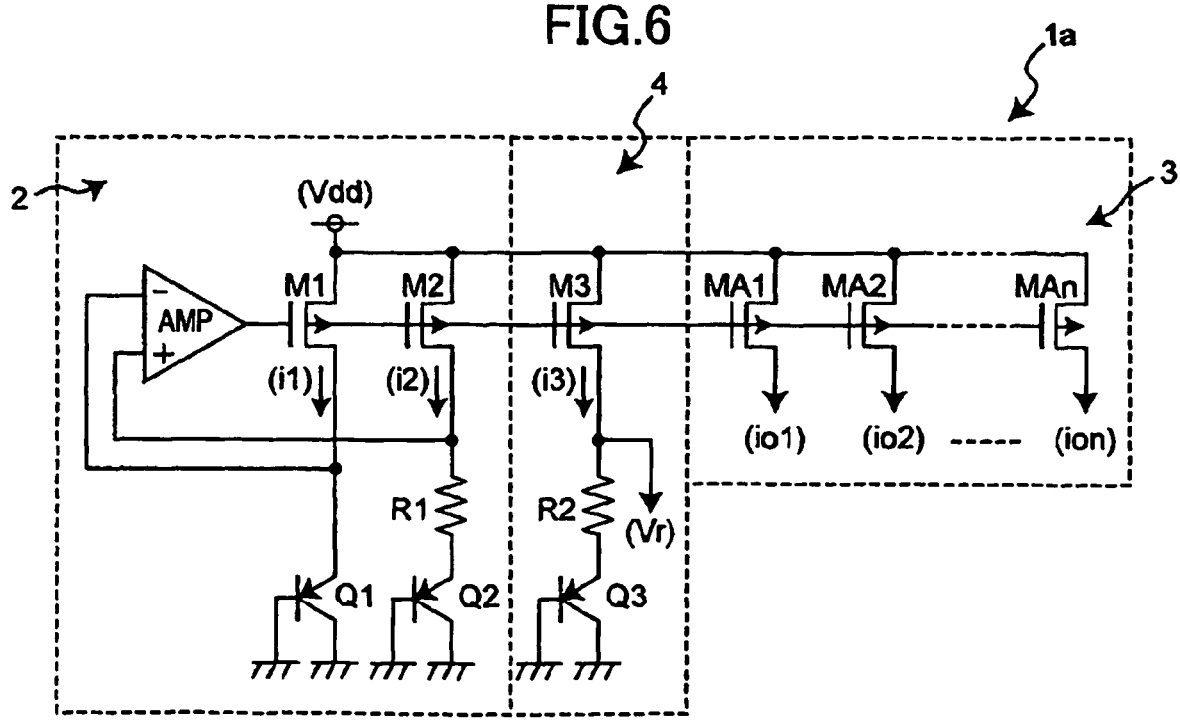
FIG. 6 is a diagram showing a structural example of a constant-current circuit according to a second embodiment of the present invention.

FIG. 6 is a diagram showing a structural example of a constant-current circuit according to the second embodiment of the present invention. In FIG. 6, each of structural elements being equal to or similar to that shown in FIG. 1 has the same reference number, and the same explanation is omitted; only the point different from that shown in FIG. 1 is explained. In addition, in FIG. 6, an example in which the reference voltage is the same in each of the constant-voltage circuits is shown.

In FIG. 6, the point different from that shown in FIG. 1 is as follows. That is, a reference voltage generating circuit 4 composed of a PMOS transistor M3 whose operation is controlled by the operational amplification circuit AMP, a pnp transistor Q3, and a resistor R2 is provided. Due to this, the constant-current circuit 1 shown in FIG.1 is changed to a constant-current circuit 1a.

In FIG. 6, the constant-current circuit 1a generates plural predetermined constant currents io1 through ion and a predetermined reference voltage Vr and outputs the generated currents and voltage. The constant-current circuit 1a consists of a reference current generating circuit 2, a proportional current generating circuit 3, and the reference voltage generating circuit 4 that generates the predetermined reference voltage Vr and outputs the generated voltage.

The reference voltage generating circuit 4 consists of the PMOS transistor M3, the pnp transistor Q3, and the resistor R2; the PMOS transistor M3, the resistor R2, and the pnp transistor Q3 are connected in series between the power source voltage Vdd and ground voltage. The gate of the PMOS transistor M3 is connected to the output terminal of the operational amplification circuit AMP, and the base of the pnp transistor Q3 is connected to ground voltage. The reference voltage Vr is output from the connection point of the PMOS transistor M3 with the resistor R2. In this, the PMOS transistor M3 is a third transistor, the resistor R2 is a second resistor, the pnp transistor Q3 is a third pn junction element, and the series circuit composed of the resistor R2 and the pnp transistor Q3 is a second series circuit.

In this structure, the reference voltage Vr is shown in the following equation (3). In the following equation (3), the voltage between the base and the emitter of the pnp transistor Q3 is defined as Vbe3, the resistance value of the resistor R2 is defined as R2, and the current to be output from the PMOS transistor M3 is defined as 13.

$$Vr = Vbe3 + i3 \times R2 = Vbe3 + R2/R1 \times \Delta Vbe \quad (3)$$

In the above equation (3), the voltage between the base and the emitter Vbe3 has a negative temperature coefficient, and ΔVbe has a positive temperature coefficient. Due to this, the temperature coefficient of the reference voltage Vr can be made very small by suitably selecting the value and the temperature coefficient of R2/R1.

Figure 7:
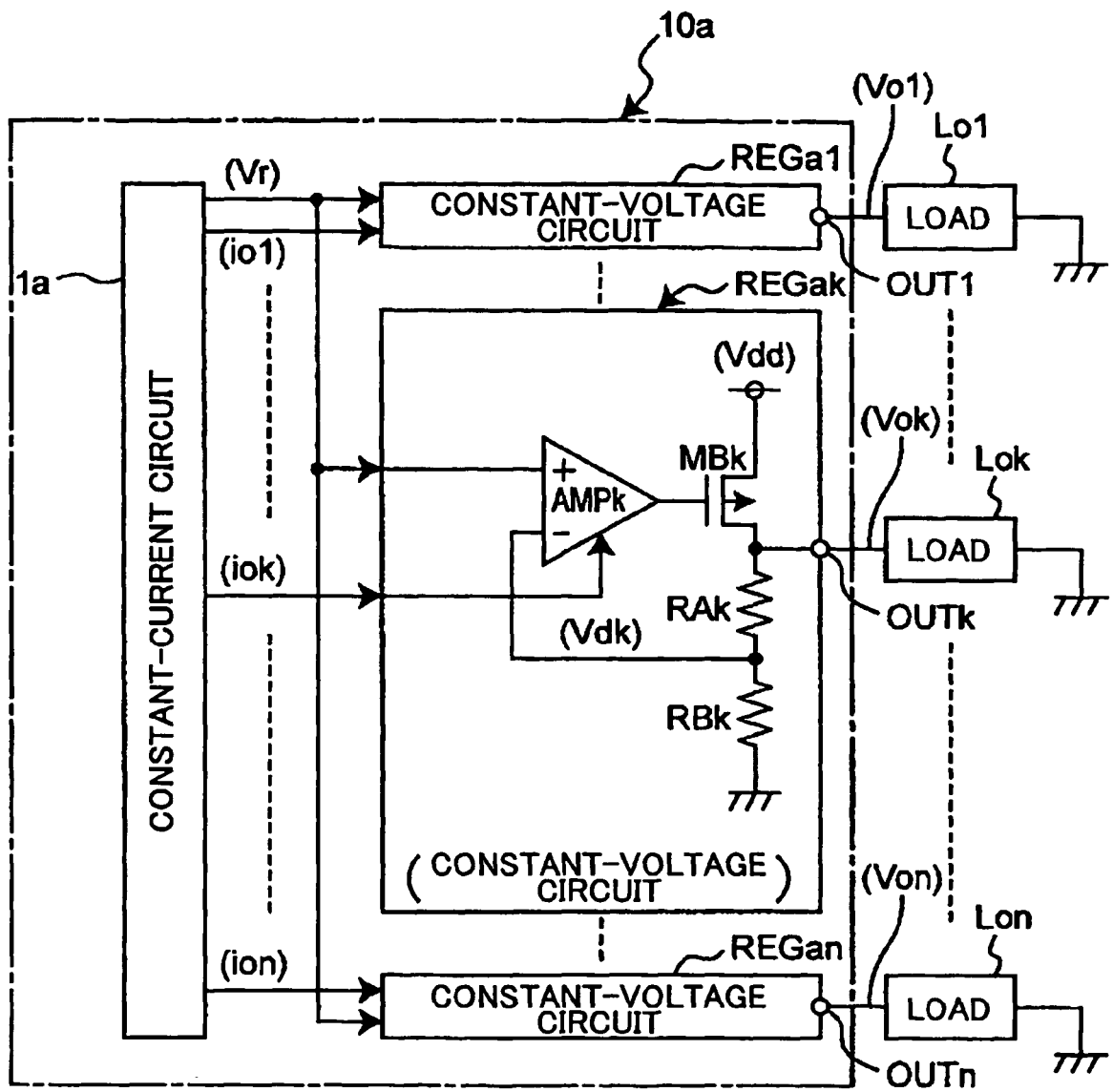
FIG. 7 is a diagram showing an example of a system power source used a constant-current circuit 1a shown in FIG. 6.
Figure 8:
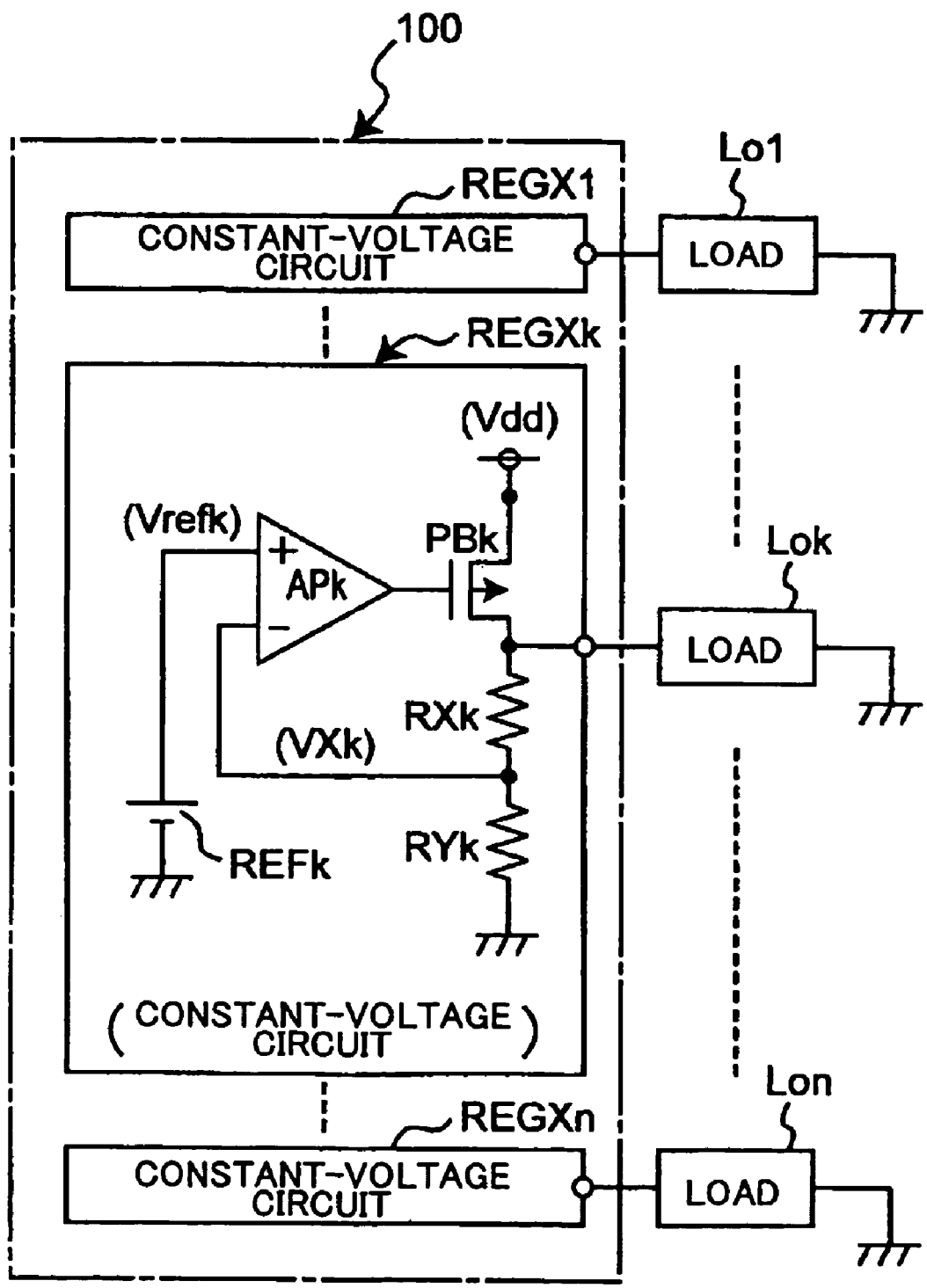
FIG. 8 is a diagram showing an example of a system power source.
Figure 9:
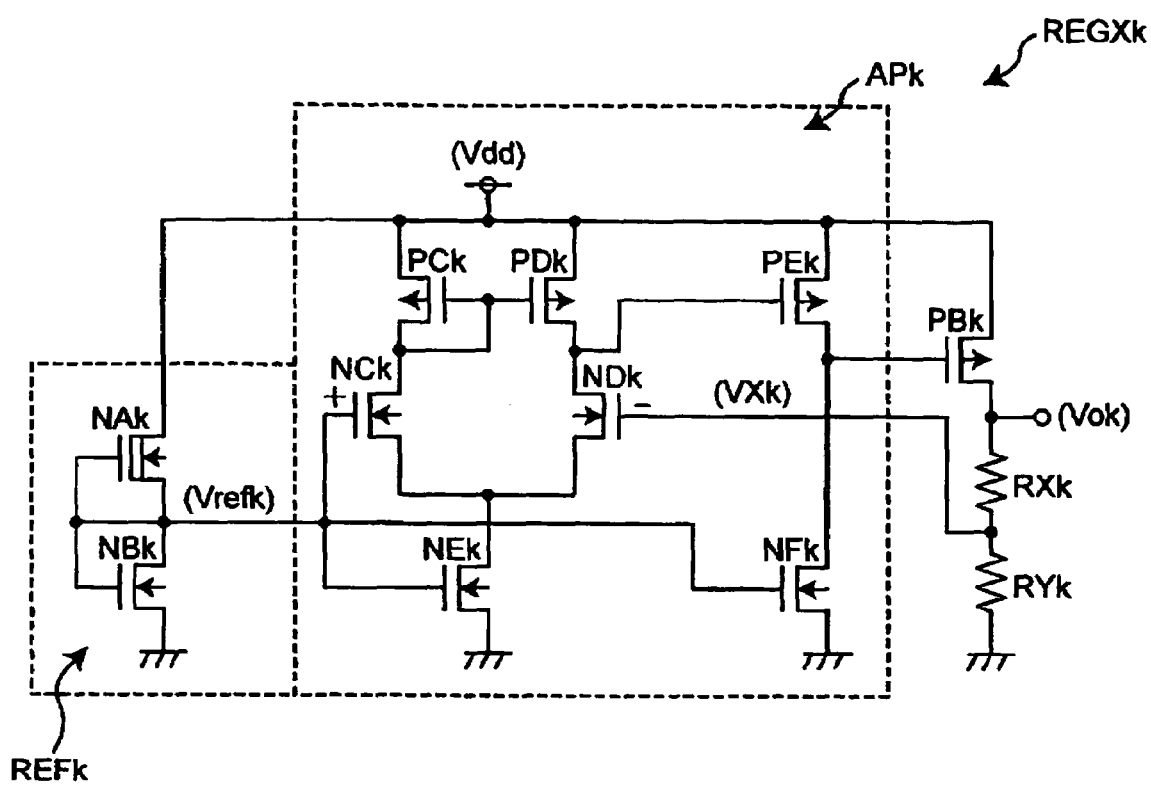
FIG. 9 is a diagram showing a circuit example of one of constant-voltage circuits REGX1 to REGXn shown in FIG. 8.

FIG. 7 is a diagram showing an example of a system power source using the constant-current circuit 1a shown in FIG. 6. In FIG. 7, each of structural elements being equal to or similar to that shown in FIG. 2 has the same reference number, and the same explanation is omitted; only the point different from that shown in FIG. 2 is explained.

In FIG. 7, the point different form that shown in FIG. 2 is as follows. That is, the reference voltage generating circuits G1 through Gn are removed from the constant-voltage circuits REG1 through REGn shown in FIG. 2, and the reference voltage Vr from the constant-current circuit 1a is input to each non-inverting input terminal of the operational amplification circuits AMP1 through AMPn. Accordingly, in FIG. 7, the constant-voltage circuits REG1 through REGn shown in FIG. 2 are changed to constant-voltage circuits REGa1 through REGan, the constant-current circuit 1 shown in FIG. 2 is changed to the constant-current circuit 1a, and the system power source 10 shown in FIG. 2 is changed to a system power source 10a.

As mentioned above, the constant-current circuit according to the second embodiment provides the reference voltage generating circuit 4, which generates the predetermined reference voltage Vr and outputs the generated voltage, in the constant-current circuit of the first embodiment. Due to this, in the second embodiment, an effect similar to that of the first embodiment can be obtained. Further, in the system power source having the plural constant-voltage circuits, the reference voltage that is necessary for each of the constant-voltage circuits can be supplied from the constant-current circuit, and it is not necessary for each of the constant-voltage circuits to provide a reference voltage generating circuit; consequently, the area for forming the reference voltage generating circuit becomes unnecessary, and a highly accurate reference voltage, in which the dispersion of voltage is small and the temperature characteristic is excellent, can be obtained. Therefore, trimming for adjusting the output voltages of the constant-voltage circuits is not required and the chip area of the system power source can be made small.

In the first and second embodiments, in order that the explanation can be understood easily, cases in which each constant-voltage circuit has the same circuit structure are explained; however, the present invention is not limited to this. For example, it is not necessary that each constant-voltage circuit have the same circuit structure, and it is enough that the structure in which the bias currents can be supplied to the plural constant-voltage circuits be formed. In addition, in the second embodiment, in order that the explanation can be understood easily, a case in which all of the reference voltages being used in the constant-voltage circuits REGa1 through REGan are the same is explained; however, the present invention is not limited to this, and can be applied to a case in which at least one constant-voltage circuit uses the reference voltage Vr from the constant-current circuit 1a.

While the present invention is described above with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Application No. 2004-296479 filed on Oct. 8, 2004.

The invention claimed is:

1. A constant-current circuit that generates a plurality of constant currents and outputs the generated constant currents, comprising:

a first transistor that generates a current corresponding to a signal input to a control electrode and outputs the generated current;

a first pn junction element to which the current output from the first transistor is supplied;

a second transistor that generates a current corresponding to a signal input to a control electrode and outputs the generated current;

a first series circuit in which a first resistor and a second pn junction element are connected in series and to which the current output from the second transistor is supplied;

a control circuit that controls the operation of the first and the second transistors so that a voltage of a connection point of the second transistor with the first resistor is equal to that of a connection point of the first transistor with the first pn junction element; and a proportional current generating circuit that generates a plurality of currents the currents being proportional to a current flowing in the first resistor;

wherein the first resistor is connected to a potential difference generated by a difference of current densities flowing in the first and the second pn junction elements, the proportional current generating circuit consists of a plurality of transistors for generating proportional current to whose control electrodes a control signal output from the control circuit to the second transistor is input, and a current proportional to a current flowing in the first resistor is generated in each of the transistors for generating proportional current and the generated current is output.

2. The constant-current circuit as claimed in claim 1, wherein the control circuit is an operational amplification circuit to whose corresponding input terminals the voltage of the connection point of the second transistor with the first resistor and the voltage of the connection point of the first transistor with the first pn junction element are respectively input, and the operation of the first and the second transistors and the transistors for generating proportional current is controlled by the operational amplification circuit.

3. The constant-current circuit as claimed in claim 1, wherein
the first resistor has a temperature characteristic that offsets a temperature characteristic of a potential difference generated by a difference of current densities flowing in the first and the second pn junction elements.

4. The constant-current circuit as claimed in claim 1, further comprising:
a third transistor that generates a current corresponding to a signal input from the control circuit to a control electrode and outputs the generated current; and
a second series circuit in which a second resistor and a third pn junction element are connected in series and to which the current output from the third transistor is supplied;
wherein
a voltage of a connection point of the third transistor with the second resistor is output as a predetermined reference voltage.

5. The constant-current circuit as claimed in claim 4, wherein
each resistance value and each temperature coefficient of the first and the second resistors are set respectively so that a variation of the reference voltage caused by the temperature characteristic of a voltage at both ends of the third pn junction element is offset.

6. The constant-current circuit as claimed in claim 1, wherein
the first and the second transistors are MOS transistors whose sources are connected to each other and whose gates are connected to each other, and the transistors for generating proportional current are MOS transistors whose sources are connected to the sources of the first and the second transistors and whose gates are connected to the gates of the first and the second transistors.

7. The constant-current circuit as claimed in claim 4, wherein
the first through the third transistors are MOS transistors whose sources are connected to each other and whose gates are connected to each other, and the transistors for generating proportional current are MOS transistors whose sources are connected to the sources of the first through the third transistors and whose gates are connected to the gates of the first through the third transistors.

8. A system power source providing a plurality of constant-voltage circuits that generate predetermined voltages and output the generated voltages to corresponding loads comprising:
a constant-current circuit that generates a plurality of constant currents and outputs the generated constant currents to the corresponding constant-voltage circuits as bias currents;
wherein
the constant-current circuit includes a first transistor that generates a current corresponding to a signal input to a control electrode and outputs the generated current; a first pn junction element to which the current output from the first transistor is supplied; a second transistor that generates a current corresponding to a signal input to a control electrode and outputs the generated current; a first series circuit in which a first resistor and a second pn junction element are connected in series and to which the current output from the second transistor is supplied; a control circuit that controls the operation of the first and the second transistors so that a voltage of a connection point of the second transistor with the first resistor is equal to that of a connection point of the first transistor with the first pn junction element; and a proportional current generating circuit that generates a plurality of currents the currents being proportional to a current flowing in the first resistor;
wherein the first resistor is connected to a potential difference generated by a difference of current densities flowing in the first and the second pn junction elements, the proportional current generating circuit consists of a plurality of transistors for generating proportional current to whose control electrodes a control signal output from the control circuit to the second transistor is input, and a current proportional to a current flowing in the first resistor is generated in each of the transistors for generating proportional current and the generated current is output.

9. The system power source as claimed in claim 8, wherein
the control circuit is an operational amplification circuit to whose corresponding input terminals the voltage of the connection point of the second transistor with the first resistor and the voltage of the connection point of the first transistor with the first pn junction element are respectively input, and the operation of the first and the second transistors and the transistors for generating proportional current is controlled by the operational amplification circuit.

10. The system power source as claimed in claim 8, wherein
the first resistor has a temperature characteristic that offsets a temperature characteristic of a potential difference generated by a difference of current densities flowing in the first and the second pn junction elements.

11. The system power source as claimed in claim 8, wherein
the constant-current circuit further comprises: a third transistor that generates a current corresponding to a signal input from the control circuit to a control electrode and outputs the generated current; and a second series circuit in which a second resistor and a third pn junction element are connected in series and to which the current output from the third transistor is supplied;
wherein a voltage of a connection point of the third transistor with the second resistor is supplied to at least one of the constant-voltage circuits as a predetermined reference voltage.

12. The system power source as claimed in claim 11, wherein
each resistance value and each temperature coefficient of the first and the second resistors are set respectively so that a variation of the reference voltage caused by the temperature characteristic of a voltage at both ends of the third pn junction element is offset.

13. The system power source as claimed in claim 8, wherein
the first and the second transistors are MOS transistors whose sources are connected to each other and whose gates are connected to each other, and the transistors for generating proportional current are MOS transistors whose sources are connected to the sources of the first and the second transistors and whose gates are connected to the gates of the first and the second transistors.

14. The system power source as claimed in claim 11, wherein
the first through the third transistors are MOS transistors whose sources are connected to each other and whose gates are connected to each other, and the transistors for generating proportional current are MOS transistors whose sources are connected to the sources of the first through the third transistors and whose gates are connected to the gates of the first through the third transistors.

* * * * *